United States Patent [19]

Kim

[11] Patent Number: 5,532,515

[45] Date of Patent: Jul. 2, 1996

[54] SEMICONDUCTOR CONNECTING DEVICE

[75] Inventor: Jae K. Kim, Ichonkun, Rep. of Korea

[73] Assignee: Hyundai Electronics Industries Co., Ltd., Rep. of Korea

[21] Appl. No.: 551,540

[22] Filed: Nov. 1, 1995

Related U.S. Application Data

[63] Continuation of Ser. No. 148,839, Nov. 5, 1993, abandoned.

[30] Foreign Application Priority Data

Nov. 6, 1992 [KR] Rep. of Korea .................. 1992-20789

[51] Int. Cl.$^6$ ......................... H01L 23/48; H01L 23/52; H01L 29/40; H01L 23/28
[52] U.S. Cl. .............................................. 257/751; 257/752
[58] Field of Search .................................. 257/382, 751, 257/752

[56] References Cited

FOREIGN PATENT DOCUMENTS 2-27729  1/1990  Japan ...................................... 257/382

OTHER PUBLICATIONS

Sze et al, *Semiconductor Devices* . . . , pp. 461–465, 1985.

*Primary Examiner*—Stephen Meier
*Attorney, Agent, or Firm*—Merchant, Gould, Smith, Edell, Welter & Schmidt

[57] ABSTRACT

The semiconductor connecting device comprises a first conductive layer to be connected electrically; an insulating film covering the first conductive layer in such a way as to expose a predetermined portion of the first conductive layer, resulting in forming a contact hole; a conductive material pad formed in the contact hole so as to be connected with the first conductive layer, in a limited way over the upper surface of the insulating film; a second conductive layer formed on the extended conductive material pad, being connected with the first conductive layer; an etching barrier material formed on said conductive material pad of said contact hole and a part of the extending region, said second conductive layer being formed on the region both of said conductive material pad which is not covered with said etching barrier material and which is covered by said etching barrier material.

2 Claims, 4 Drawing Sheets

SEMICONDUCTOR CONNECTING DEVICE

This is a Continuation of application Ser. No. 08/148,839, filed Nov. 5, 1993, now abandoned.

BACKGROUND OF THE INVENTION

1. Field of the Invention

The present invention relates in general to a semiconductor connecting device and a method for making the same, and more particularly to improvements in reducing cell areas.

2. Detailed Description of the Prior Art

For convenience, description is provided of the structure of a DRAM cell in which a bit line is connected with a drain electrode in advance of a capacitor being connected with a source electrode.

Generally, a gate electrode and source/drain electrodes are formed in one active region, followed by the formation of a bit line to be connected with the drain electrode. For the sake of forming a charge storage electrode contact in the source electrode, the bit line is positioned above a device separation insulating film which is between the source electrodes, in such a way that the bit line is not placed above the source electrode or is overlapped with the source electrode only in a minimal part.

A conventional method for making the above bit line is described with reference to a few figures.

Referring initially to FIG. 1, there is a schematic plan view showing only important mask layers. For example, while reference mark A designates an active region mask, B, C, D, E, and F designate a first bit line contact mask, a pad mask, a second bit line mask, a bit line mask, and a charge storage electrode contact mask, respectively. As shown in this figure, the first bit line contact mask B is electrically connected with the second bit line contact mask D via the pad mask C.

For a more detailed description, FIGS. 2A to 2C are referenced in, which there are schematic cross-sectional views illustrating the steps for fabricating a DRAM cell according to a conventional method, respectively, taken generally through section line A—A' of FIG. 1.

First, as shown in FIG. 2A, on a predetermined portion of a semiconductor substrate 1, an active region and a device separation insulating film 2 are formed, followed by the formation of a gate electrode (not shown), a source electrode (not shown) and a drain electrode 3 over the active region. Next, an interlayer insulating film 4 is formed on the resulting structure, and then, a first bit line contact is formed by use of the first bit line contact mask B, followed by the formation of a conductive material pad 5'. At this time, the conductive material pad 5' is formed in such a way to cover the first bit line contact enough and extend partially the device separation insulating film.

Subsequently, another interlayer insulating film 6 is formed, as shown in FIG. 2B.

Finally, using the second bit line contact mask D, a second bit line contact is formed on a predetermined portion of the conductive pad 5' which is placed over the device separation insulating film 2. Following this, a bit line 7' is formed in the second bit line contact, as shown in FIG. 2C. At this time, via the second bit line contact, the bit line 7' is connected with the conductive pad 5' which is, in turn, connected with the drain electrode 3 via the first bit line contact. As a result, the bit line 7' is electrically connected with the drain electrode 3.

When the bit line is connected with the drain electrode in such conventional method, the bit line is not positioned above the source electrode on which the charge storage electrode is to be formed later. The conventional method and accompanied structure, however, requires complicate steps to be undertaken in order to interconnect the drain electrode and the bit line. In addition, the device separation insulating films between which the conductive material pad is formed occupy much room in the cell, so as to reduce the usable room in the cell when scaling a semiconductor down.

SUMMARY OF THE INVENTION

Therefore, an object of the present invention is to solve the aforementioned problems encountered in the prior art and to provide a semiconductor connecting device and a method for making the same, capable of simplifying the connecting process and minimizing cell area.

According to one aspect of the present invention, this object can be accomplished by the provision of a semiconductor connecting device comprising a first conductive layer to be connected electrically; an insulating film covering the first conductive layer in such a way as to expose a predetermined portion of the first conductive layer, resulting in forming a contact hole; a conductive material pad formed in the contact hole so as to be connected with the first conductive layer, extending in a limited way over the upper surface of the insulating film; a second conductive layer formed on the extended conductive material pad, being connected with the first conductive layer; wherein the improvement comprises an etching barrier material formed on said conductive material pad of said contact hole and a part of the extending region, said second conductive layer being formed on the region of said conductive material pad uncovered with said etching barrier material and on said etching barrier material.

According to another aspect of the present invention, the object can be accomplished by the provision of a method comprising of steps of: coating an insulating film on a first layer in such a way as to expose a predetermined portion of the first layer, resulting in forming a contact hole; forming a first conductive material on a predetermined of the first insulating film and in the contact hole; connecting a second conductive layer with a predetermined portion of the first conductive material pad to connect the first conductive material with the second conductive layer, wherein the improvement comprises the steps of: depositing an etching barrier material having a large etch selection ratio on the conductive material pad; patterning the etching barrier material with a pad mask to form a pattern; depositing a conductive material for bit line on the resulting structure; forming a photosensitive film pattern on the conductive material for bit line in such a way as to expose the upper portion of the contact region, said photosensitive film covering the connected region between the conductive material and the first conductive material for bit line; and applying an etch process to the conductive material for bit line and the first conductive material pad by use of the photosensitive pattern to connect the second conductive layer and the second conductive material pad.

The above and other objects and advantages of the present invention will become more apparent as the following description proceeds.

To the accomplishment of the foregoing and related ends, the invention, then, comprises the features hereinafter fully described in the specification and particularly pointed out in claims, the following description and the annexed drawing setting forth in detail a certain illustrative embodiment of the invention, this being indicative, however, of but one of the various ways in which the principles of the invention may be employed.

DETAILED DESCRIPTION OF THE PREFERRED EMBODIMENTS

Figure 1:
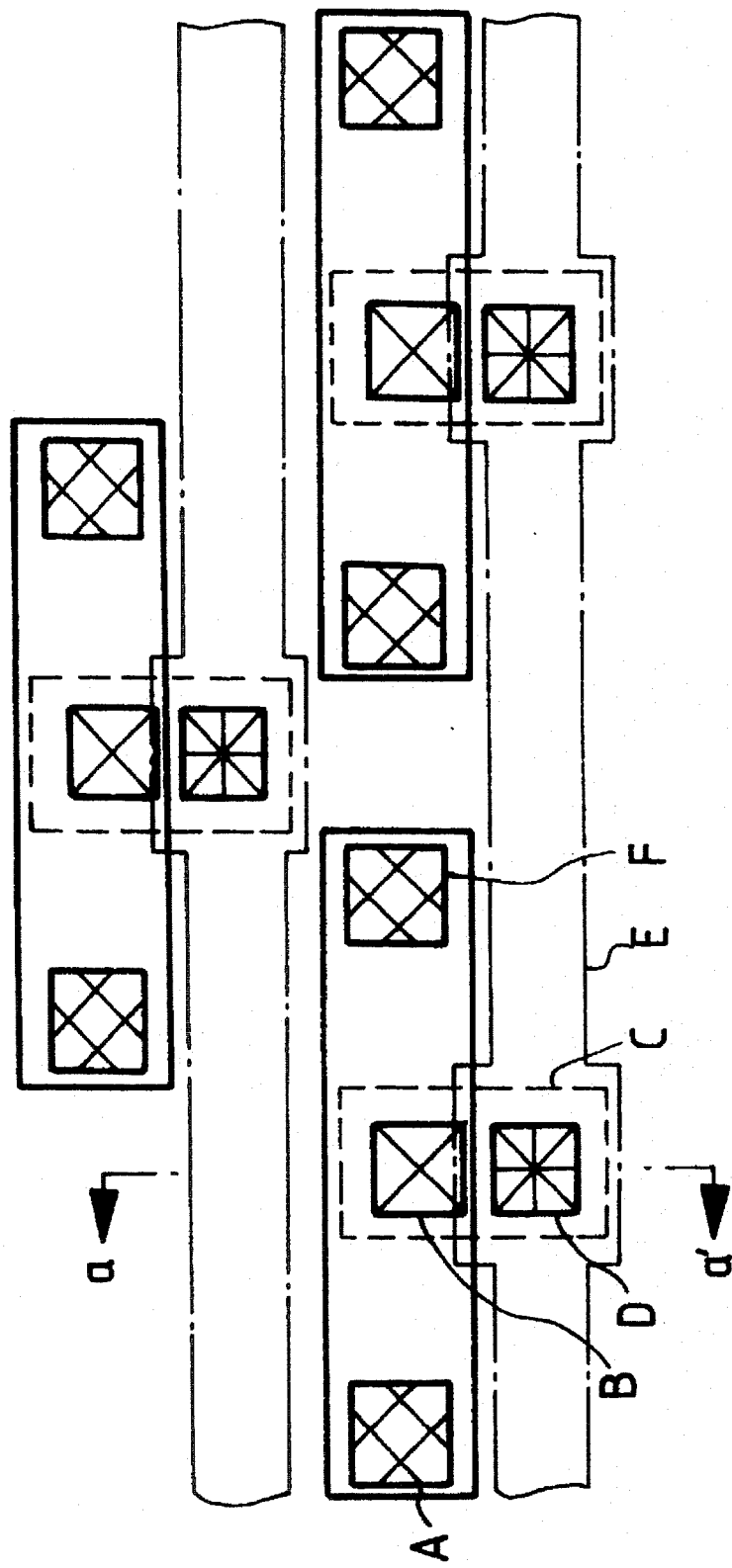
FIG. 1 is a schematic plan view showing only important mask layers needed to illustrate a conventional method for fabricating a DRAM cell, in which a bit line connected via a conductive material pad with a drain electrode is formed in advance of a capacitor connected with a source electrode.
Figure 2A:
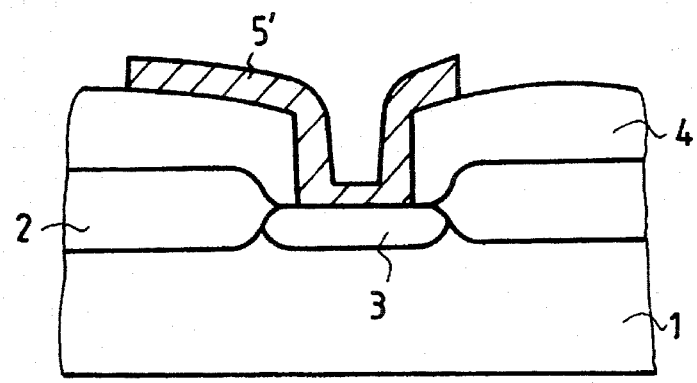
FIGS. 2A to 2C are schematic, cross sectional views illustrating the steps for making a bit line according to a conventional method, respectively, taken generally through section line A—A' of FIG. 1.
Figure 2B:
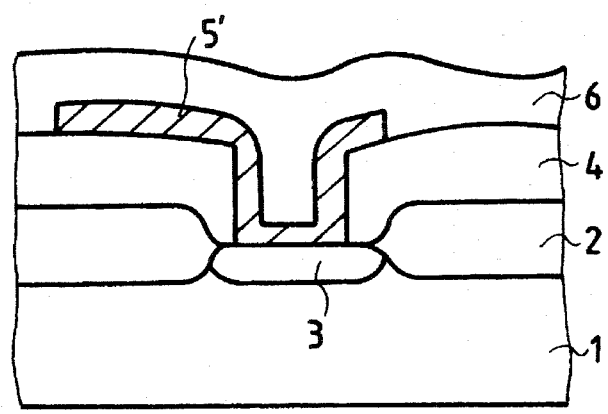
Figure 2C:
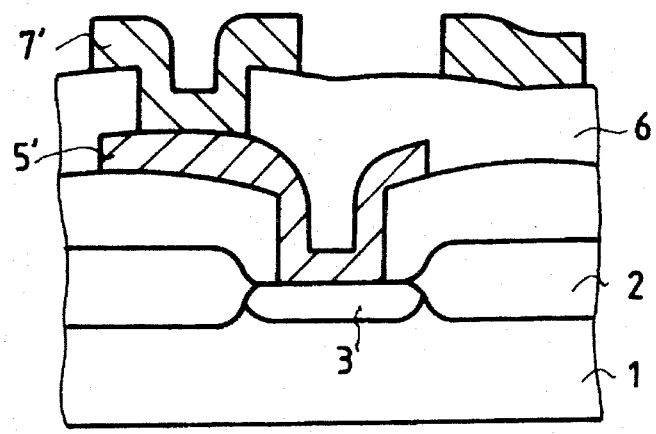

Hereinafter, the preferred embodiments will be described in detail with reference to several drawings, wherein like reference numerals designate like parts.

Figure 3:
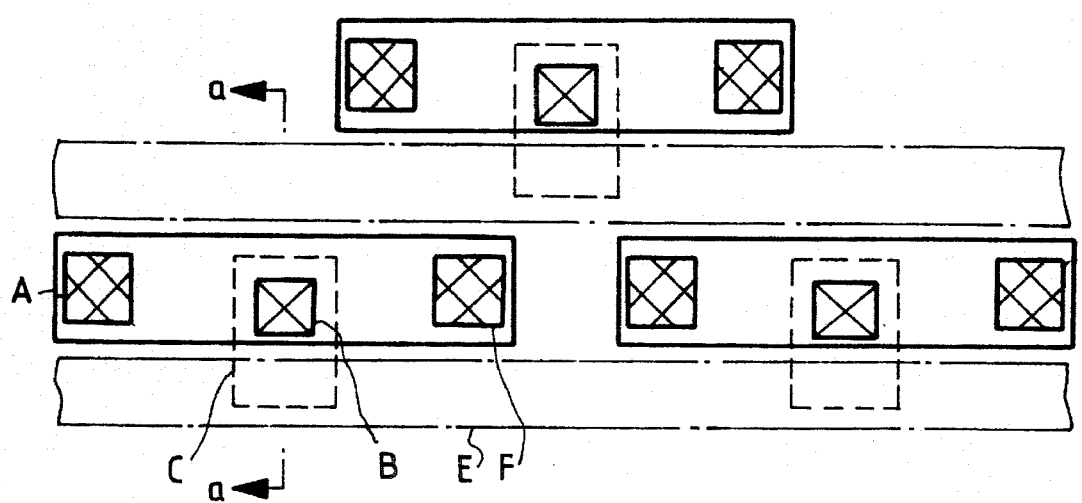
FIG. 3 is a schematic plan view showing only important mask layers needed to illustrate the inventive method for fabricating a DRAM cell, in which a bit line connected via a conductive material pad with a drain electrode is formed in advance of a capacitor being connected with a source electrode.

FIG. 3 shows only important mask layers in a plan view. As shown in FIG. 3 a drain electrode is connected with a bit line without forming a second contact hole. For this, an additional conductive pad is formed, which plays a role in interconnecting the drain electrode and the bit line. Following the formation of the conductive pad and an etching barrier material, a predetermined portion of the etching barrier material is etched by use of pad mask and immediately, the bit line is connected with the conductive pad.

Figure 4:
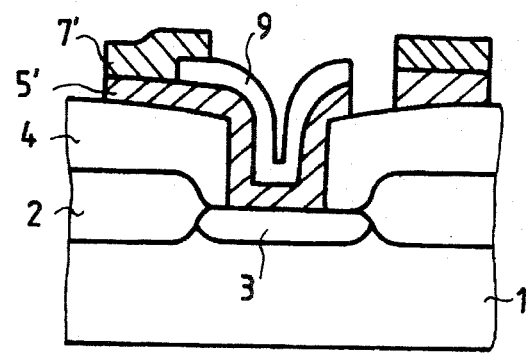
FIG. 4 is a schematic cross sectional view showing a semiconductor device in which a bit line is electrically connected with a drain electrode, according to the present invention.

Referring now to FIG. 4, there is a cross-sectional view showing the structure of a connecting device according to the present invention, taken generally through section line a—a' of FIG. 3. As shown in this figure, the semiconductor connecting device is formed of a semiconductor substrate which comprises a drain electrode 3; an interlayer insulating film 4 forming a contact hole so as to expose a predetermined portion of the drain electrode therethrough; a conductive pad 5' formed on specified, upper portions of the interlayer insulating film 4 and within the contact hole, the conductive pad 5' being connected with the drain electrode 3; an etching barrier material 9 formed on a specified portion of the conductive pad 5' in the contact hole; and a bit line 7' formed on the upper portions of the conductive pad 5' and the etching barrier material 9.

Figure 5A:
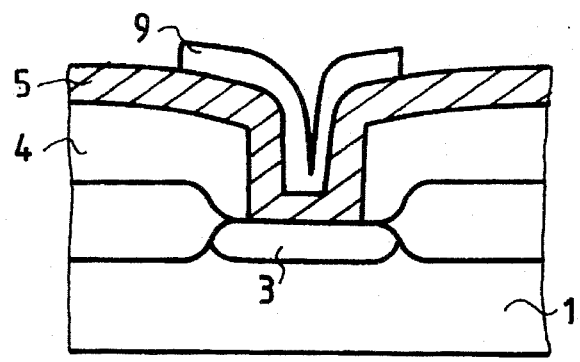
FIGS. 5A to 5C are schematic cross sectional views illustrating the steps for making a bit line according to the present invention, respectively, taken generally through section line A—A' of FIG. 1.
Figure 5B:
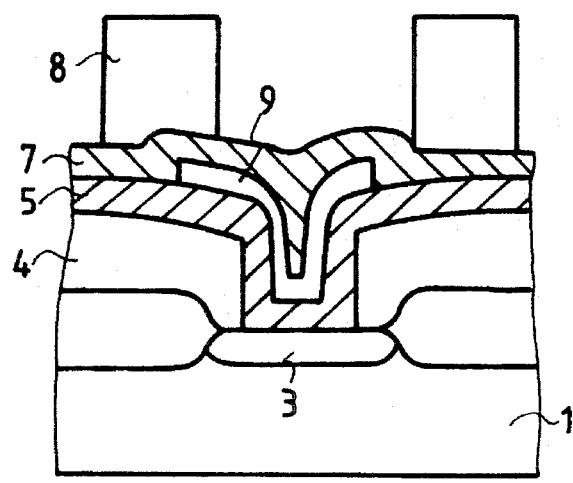
Figure 5C:
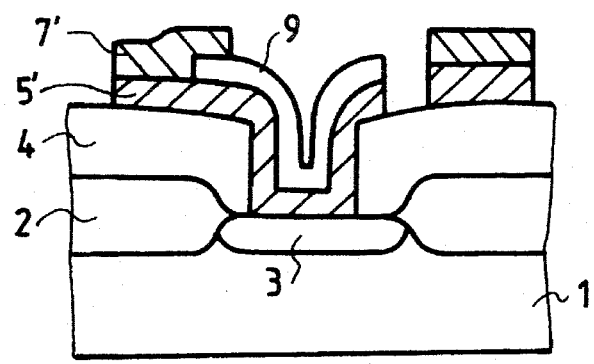

Detailed description of the method for making the semiconductor connecting device is provided with reference to FIGS. 5A to 5C, which are cross-sectional views illustrating the steps of the method, respectively, taken generally through section line a—a' of FIG. 3.

First, on a predetermined portion of a semiconductor substrate 1, an active region and a device separation insulating film 2 are formed, followed by the formation of a gate electrode (not shown), a source electrode (not shown) and a drain electrode 3 over the active region, as shown in FIG. 5A. Next, an interlayer insulating film 4 is formed, and then, a first bit line contact is formed on a predetermined portion of the drain electrode 3 by use of the first bit line contact mask B of FIG. 3. Following this, a conductive pad 5 is formed on the resulting structure and then, over the conductive pad 5 is formed an etching barrier material 9 which is etched at a much slower speed (i.e., has a greater etch selection ratio) than a conductive material for a second bit line to be formed later. Using the pad mask C of FIG. 3, specified portions of the etching barrier material are etched. At this time, the etching barrier material 9 is formed in such a way as to cover enough of the first bit line contact. When applying an etch process to a predetermined portion of the etching barrier material 9, the exposed conductive material of pad 5 may be altogether etched.

Subsequently, a conductive material 7 is formed on the resulting structure, in which a part of the conductive material of pad 5 is exposed due to the removal of a part of the etching barrier material 9. Thereafter, a photosensitive film is formed on the conductive material 7 and is subjected to patterning to form a pattern 8 in such a way as to expose the contact region formed in the previous process. The photosensitive film pattern 8 works as a bit line mask.

At this time, the photosensitive film is so patterned as to make the conductive material 7 for the second bit line to overlap the etching barrier material in such a way that the overlapped area is minimized, as well as to make the etching barrier material 9 covering the bit line contact separated spatially from adjacent bit lines. Further, in case that an etch process is applied to not only the etching barrier material 9 but also the conductive material pad 5 by use of the pad mask, as discussed in the step of FIG. 5A, the photosensitive film pattern 8 is so formed as to interconnect the conductive material 7 for bit line with the side wall of the conductive material of pad 5 etched.

Using the bit line mask, the predetermined portion of the conductive material 7 for the second bit line and the conductive material pad 5 are etched so as to form a bit line 7' and a conductive material pad 5', as shown in FIG. 5C. At this time, the upper conductive material 7 for the second bit line is etched in the exposed bit line contact region through the bit line mask 8, while the lower conductive material pad 5 is protected by the etching barrier material 9 from the etching. As shown in FIG. 5B and 5C, the etching barrier material 9 has an edge interiorly of an etch perimeter defined by mask 8 such that after etching, the etching barrier material and the conductive material pad have the edge in common. As a result of the process, the resulting bit line 7' is connected, at a portion uncovered with the etching barrier material 9, with the resulting conductive material pad 5 being connected with the drain electrode 3 via the bit line contact. Consequently, the bit line 7' is electrically connected with the drain electrode 3.

It is apparent that the connecting method according to the present invention can be equally true of any case in that the drain electrode is made of a conductive material.

What is claimed is:

1. A semiconductor connecting device comprising a first conductive layer;

an insulating film covering the first conductive layer, said insulating film having a contact hole through to said first conductive layer;

a conductive material pad formed in the contact hole so as to be connected with the first conductive layer, said conductive material pad forming an extended region over the insulating film, said conductive material pad having a first edge;

an etching barrier material formed on said conductive material pad over said contact hole and a part of the extended region, said etching barrier material having a second edge, said first and second edges meeting in a common contour with one another since said etching barrier material functions as a mask on said conductive material pad when said first and second edges are formed; and a second conductive layer formed on a surface region of said conductive material pad including a first area which is covered by said etching barrier material and a second area which is not covered by said etching barrier material.

2. A semiconductor connecting device according to claim 1, wherein said first conductive layer and said second conductive layer are a drain electrode and a bit line, respectively.

* * * * *